(12) United States Patent
Chen et al.

(10) Patent No.: US 9,039,925 B2
(45) Date of Patent: May 26, 2015

(54) POLISHING SLURRY COMPOSITION

(75) Inventors: Wei-Jung Chen, Tainan (TW); Wen-Tsai Tsai, Taipei (TW); Ho-Ying Wu, New Taipei (TW); Song-Yuan Chang, Chiayi County (TW); Ming-Hui Lu, Taipei (TW)

(73) Assignee: UWIZ Technology Co., Ltd., Taoyuan County (TW)

( * ) Notice: Subject to any disclaimer, the term of this patent is extended or adjusted under 35 U.S.C. 154(b) by 0 days.

(21) Appl. No.: 13/568,130

(22) Filed: Aug. 7, 2012

(65) Prior Publication Data
US 2013/0264515 A1 Oct. 10, 2013

(30) Foreign Application Priority Data
Apr. 10, 2012 (TW) .............................. 101112637 A

(51) Int. Cl.
| H01L 21/302 | (2006.01) |
| H01L 21/461 | (2006.01) |
| C03C 15/00 | (2006.01) |
| C03C 25/68 | (2006.01) |
| C09K 13/00 | (2006.01) |
| C09K 13/06 | (2006.01) |
| C09G 1/02 | (2006.01) |
| C23F 3/04 | (2006.01) |
| H01L 21/321 | (2006.01) |

(52) U.S. Cl.
CPC ... *C09G 1/02* (2013.01); *C23F 3/04* (2013.01); *H01L 21/3212* (2013.01)

(58) Field of Classification Search
None
See application file for complete search history.

(56) References Cited

U.S. PATENT DOCUMENTS

| 2003/0124959 | A1* | 7/2003 | Schroeder et al. .............. 451/41 |
| 2008/0026583 | A1* | 1/2008 | Hardy et al. ................... 438/693 |
| 2009/0095939 | A1* | 4/2009 | Chou et al. .................... 252/79.1 |
| 2009/0318063 | A1* | 12/2009 | Misra .............................. 451/28 |

FOREIGN PATENT DOCUMENTS

| TW | 584658 | 4/2004 |
| TW | 200513527 | 4/2005 |
| TW | 200706619 | 2/2007 |
| TW | 201002804 | 1/2010 |

* cited by examiner

*Primary Examiner* — Stephanie Duclair
(74) *Attorney, Agent, or Firm* — Jianq Chyun IP Office

(57) ABSTRACT

Provided is a polishing slurry composition, including a non-ionic surfactant represented by the following formula (1)

$$R-(OCH_2CH_2)_x-OH \qquad \text{formula (1)}$$

wherein x is an integer from 1 to 50, and R is selected from a group consisting of a C3-C50 alkyl group, a C6-C55 benzylalkyl group and a C6-C55 phenylalkyl group.

24 Claims, No Drawings

POLISHING SLURRY COMPOSITION

CROSS-REFERENCE TO RELATED APPLICATION

This application claims the priority benefit of Taiwan application serial no. 101112637, filed on Apr. 10, 2012. The entirety of the above-mentioned patent application is hereby incorporated by reference herein and made a part of this specification.

BACKGROUND OF THE INVENTION

1. Field of the Invention

The invention relates to a polishing slurry composition, particularly to a polishing slurry composition used in chemical mechanical polishing (CMP) to remove metal thin films and effectively control the extent of dishing.

2. Description of Related Art

Chemical mechanical polishing is the process of removing material (e.g. deposited thin films) by applying a combination of chemical reactions and mechanical polishing. Chemical mechanical polishing can make the surface of a material smoother and more even. Chemical mechanical polishing is often used to remove the excess metal film in a typical manufacturing process of semiconductors, so as to form a metal interconnection. For example, because of the development of Damascene manufacturing process, chemical mechanical polishing becomes widely used in the manufacturing process of the copper interconnection.

In the manufacturing process of chemical mechanical polishing, the wafer is typically fixed to a carrier and pressed against a polishing pad. At the same time, a polishing slurry is conveyed to the surface of the polishing pad. The polishing slurry contains large amounts of polishing particles and various kinds of chemicals which react with a material to be polished, so as to dissolve the material or to form compounds, and the compounds are removed by the polishing particles due to mechanical friction as the polishing pad spins or moves.

Even though chemical mechanical polishing is widely employed in the manufacturing process of semiconductors, it still creates some defects such as scratching, corrosion and dishing. These problems remain to be solved.

SUMMARY OF THE INVENTION

The invention provides a polishing slurry composition which effectively inhibits dishing caused by chemical mechanical polishing.

The invention provides a polishing slurry composition including a non-ionic surfactant. The non-ionic surfactant is represented by the following formula (1):

$$R-(OCH_2CH_2)_x-OH \quad \text{formula (1)}$$

in which x is an integer from 1 to 50.

According to the polishing slurry composition of an embodiment of the invention, x is an integer between 7 and 40.

According to the polishing slurry composition of an embodiment of the invention, R is selected from a group consisting of a C3-C50 alkyl group, a C3-C50 hydroxyalkyl group, a C6-C55 benzylalkyl group and a C6-C55 phenylalkyl group.

According to an embodiment of the invention, the non-ionic surfactant is represented by formula (2),

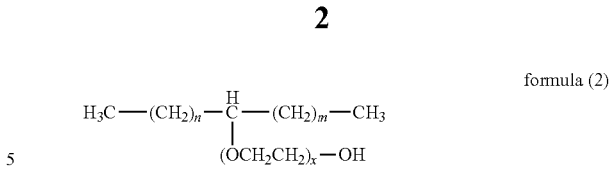

formula (2)

wherein m+n is an integer between 2 and 15.

According to an embodiment of the invention, a content of the non-ionic surfactant is between 5 ppm and 5000 ppm based on the total weight of the polishing slurry composition.

According to an embodiment of the invention, a content of the non-ionic surfactant is between 10 ppm and 1000 ppm based on the total weight of the polishing slurry composition.

According to an embodiment of the invention, the polishing slurry composition further includes an oxidizing agent.

According to an embodiment of the invention, the oxidizing agent is one or more selected from a group consisting of permanganate salt, peroxyacid, iodate salt, oxybromide salt, ceric salt, bromate salt, hydrogen peroxide, chlorite salt and hypochlorite salt.

According to an embodiment of the invention, a content of the oxidizing agent based on the total weight of the polishing slurry composition is between 0.5% and 10%.

According to an embodiment of the invention, the polishing slurry composition further includes polishing particles.

According to an embodiment of the invention, a content of the polishing particles based on the total weight of the polishing slurry composition is between 100 ppm and 5000 ppm.

According to an embodiment of the invention, an average diameter of the polishing particles is between 5 nm and 300 nm.

According to an embodiment of the invention, an average diameter of the polishing particles is between 5 nm and 100 nm.

According to an embodiment of the invention, the polishing particles are one or more selected from a group consisting of silicon dioxide, aluminum oxide, cerium oxide, zirconium dioxide and titanium dioxide.

According to an embodiment of the invention, a pH value of the polishing slurry composition is between 5 and 11.

According to an embodiment of the invention, the polishing slurry composition further includes a pH adjustor.

According to an embodiment of the invention, the pH adjustor is one or more selected from a group consisting of potassium hydroxide, triethanolamine, 2,2,2-nitrilotriethanol, nitric acid, sulfuric acid, oxalic acid and citric acid.

According to an embodiment of the invention, a content of the pH adjustor based on the total weight of the polishing slurry composition is 5 ppm to 10,000 ppm.

According to an embodiment of the invention, the polishing slurry composition further includes a chelating agent.

According to an embodiment of the invention, the chelating agent includes inorganic acids, organic acids or amino acids.

According to an embodiment of the invention, the chelating agent is one or more selected from a group consisting of citric acid, diethylenetriaminepentaacetate, ammonium oxlate, tartaric acid, oxalic acid, maleic acid, lactic acid, succinic acid, histidine, alanine, glycine, aspartate, glutamine, serine and arginine.

According to an embodiment of the invention, a content of the chelating agent based on the total weight of the polishing slurry composition is between 0.1% and 10%.

According to an embodiment of the invention, the polishing slurry composition further includes an corrosion inhibitor.

According to an embodiment of the invention, the corrosion inhibitor is one or more selected from a group consisting of 1-H-benzotriazole, N-acyl sarcosinate, ammonium dodecylsulfate, tolyltriazole, 5-amino tetrazole, 3-amino-1,2,4-triazole, 4-amino-4H-1,2,4-triazole, 3-nitro-1,2,4-triazole, 3-mercapto-1,2,4-triazole, 1H-1,2,3-triazole-ethanol, benzimidazole, imidazole, pyrrole, pyrroline, oxazole, isoxazole, indazole, indolizine, 1,2,3-triazole, 1,2,4-triazole, methylbenzotriazole, 2-mercaptobenzothiazole, benzylidene dioxotetrahydro thiazole, thenylidene dioxotetrahydro thiazole and dodecylbenzene sulfonic acid.

According to an embodiment of the invention, a content of the corrosion inhibitor based on the total weight of the polishing slurry composition is between 1 ppm and 1000 ppm.

According to an embodiment of the invention, the polishing slurry composition further includes an aqueous carrier.

According to an embodiment of the invention, a content of the aqueous carrier based on the total weight of the polishing slurry composition is between 50% and 99%.

According to an embodiment of the invention, the aqueous carrier includes deionized water.

Based on the above, the invention provides a polishing slurry composition that improves the remove rate of chemical mechanical polishing and reduces the dishing caused by the chemical mechanical polishing.

To elucidate the above-mentioned features and advantages of the invention, embodiments and their corresponding figures are described in detail below.

DESCRIPTION OF EMBODIMENTS

The embodiments of the invention provide a polishing slurry composition which is used, for example, as a polishing slurry applied on metals in chemical mechanical polishing. The polishing slurry composition includes polishing particles, an oxidizing agent and a surfactant; aside from these, additives such as a chelating agent, a pH adjustor and an corrosion inhibitor can also be added according to need. Application of the above-mentioned polishing slurry composition in chemical mechanical polishing effectively reduces dishing. Each constituent of the polishing slurry composition is described in detail below.

An embodiment of the invention provides a polishing slurry composition which includes a non-ionic surfactant. The non-ionic surfactant is represented by the following formula (1):

wherein x is an integer between 1 and 50, and preferably between 7 and 40.

R is, for example, selected from a group consisting of a C3-C50 alkyl group, a C3-C50 hydroxyalkyl group, a C6-C55 benzylalkyl group and a C6-C55 phenylalkyl group.

The structure represented by formula (2) shown below is an example of a representative structure for formula (1):

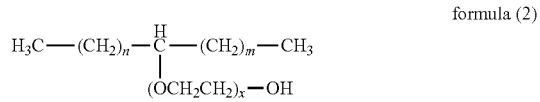

wherein m+n is an integer between 2 and 15.

In an embodiment of the invention, a content of the non-ionic surfactant based on the total weight of the polishing slurry composition is between 5 ppm and 5000 ppm, and preferably between 10 ppm and 1000 ppm.

Moreover, the polishing slurry composition of the invention may further include an oxidizing agent and polishing particles. The oxidizing agent is used to oxidize an object to be polished, such as a metal, so as to form a metal oxide, and the metal oxide is removed mechanically by the polishing particles in order to achieve planarization or removal.

In an embodiment of the invention, the oxidizing agent is one or more selected from a group consisting of permanganate salt, peroxyacid, iodate salt, oxybromide salt, ceric salt, bromate salt, hydrogen peroxide, chlorite salt and hypochlorite salt. A content of the oxidizing agent based on the total weight of the polishing slurry composition may be between 0.5% and 10%.

In an embodiment of the invention, a content of the polishing particles based on the total weight of the polishing slurry composition is between 100 ppm and 5000 ppm. An average diameter of the polishing particles may be between 5 nm and 300 nm, and preferably between 5 nm and 100 nm.

Because the pH value of the polishing slurry composition affects the ability of the polishing slurry composition to oxidize the object to be polished, the polishing slurry composition of the invention may further include a pH adjustor to adjust the pH value of the polishing slurry composition. In this embodiment, the pH value of the polishing slurry composition is, for example, between 5 and 11.

In an embodiment of the invention, the pH adjustor is one or more selected from a group consisting of potassium hydroxide, triethanolamine, 2,2,2-nitrilotriethanol, nitric acid, sulfuric acid, oxalic acid and citric acid. A content of the pH adjustor based on the total weight of the polishing slurry composition may be between 5 ppm and 10,000 ppm.

According to an embodiment of the invention, the polishing slurry composition further includes a chelating agent. The chelating agent is used to react with materials that adhere to the surface of the object to be polished and are resistant to polishing, so as to remove the materials. The chelating agent may include inorganic acids, organic acids, or amino acids. The chelating agent is one or more selected from, for example, a group consisting of citric acid, diethylenetriaminepentaacetate, ammonium oxlate, tartaric acid, oxalic acid, maleic acid, lactic acid, succinic acid, histidine, alanine, glycine, aspartate, glutamine, serine and arginine. In an embodiment of the invention, a content of the chelating agent based on the total weight of the polishing slurry composition is between 0.1% and 10%.

According to an embodiment of the invention, the polishing slurry composition further includes an corrosion inhibitor used to adjust the remove rate. The corrosion inhibitor is one or more selected from, for example, a group consisting of 1-H-benzotriazole, N-acyl sarcosinate, ammonium dodecylsulfate, tolyltriazole, 5-amino tetrazole, 3-amino-1,2,4-triazole, 4-amino-4H-1,2,4-triazole, 3-nitro-1,2,4-triazole, 3-mercapto-1,2,4-triazole, 1H-1,2,3-triazole-ethanol, benzimidazole, imidazole, pyrrole, pyrroline, oxazole, isoxazole, indazole, indolizine, 1,2,3-triazole, 1,2,4-triazole, methylbenzotriazole, 2-mercaptobenzothiazole, benzylidene dioxotetrahydro thiazole, thenylidene dioxotetrahydro thiazole and dodecylbenzene sulfonic acid. In an embodiment of the invention, a content of the corrosion inhibitor based on the total weight of the polishing slurry composition is between 11 ppm to 1000 ppm.

According to an embodiment of the invention, the polishing slurry composition further includes an aqueous carrier such as deionized water. A liquid or paste-like polishing slurry composition is obtained by adding the aforementioned oxidizing agent, polishing particles, pH adjustor, surfactant, chelating agent and corrosion inhibitor into the aqueous carrier. In this embodiment, a content of the aqueous carrier based on the total weight of the polishing slurry composition is between 50% to 99%.

Comparative and experimental examples are given below to concretely exemplify the invention. However the application of the invention is not limited to the experimental examples given below.

First, the ratio of polishing particles, chelating agent, oxidizing agent, and corrosion inhibitor is optimized. In the comparative and experimental examples below, the polishing particles are colloidal silica with an average diameter of 31 nm; the chelating agent is glycine; the oxidizing agent is hydrogen peroxide; and the corrosion inhibitor is benzotriazole.

Polishing slurries are prepared according to recipes 1 to 7 listed in Table 1 and wafer polishing tests are conducted under the following conditions:
Polishing equipment: 8 inch Mirra equipment
Wafer type: 8 inch copper blanket wafer/MIT-854 patterned wafer
Polishing pad: Praxair, 8 inch Dura polishing pad
Downward stress: 3.0 psi
Polishing slurry flow rate: 150 ml/minute
Plate/polishing head speed: 93/87 rpm
Polishing time: 1 minute

TABLE 1

| Sample | Polishing particle Content (%) | Glycine Content (%) | Hydrogen Peroxide Content (%) | Benzotriazole Content (ppm) | pH |
|---|---|---|---|---|---|
| Recipe 01 | 0.05 | 1.2 | 0.9 | 15 | 7.00 |
| Recipe 02 | 0.25 | 1.2 | 0.9 | 15 | 7.00 |
| Recipe 03 | 0.5 | 1.2 | 0.9 | 15 | 7.00 |
| Recipe 04 | 0.1 | 0.5 | 0.9 | 15 | 7.00 |
| Recipe 05 | 0.1 | 1.2 | 0.9 | 15 | 7.00 |
| Recipe 06 | 0.1 | 2.5 | 0.9 | 15 | 7.00 |
| Recipe 07 | 0.1 | 5.0 | 0.9 | 15 | 7.00 |

The test results of the remove rate and dishing of the polishing slurries made from recipes 1 to 7 are listed in Table 2.

TABLE 2

| Sample | Remove Rate (Å/minute) | Dishing Å @100/100 μm |
|---|---|---|
| Recipe 01 | 8850 | 1350 |
| Recipe 02 | 9750 | 1750 |
| Recipe 03 | 10000 | 2000 |
| Recipe 04 | 8500 | 1250 |
| Recipe 05 | 9650 | 1450 |
| Recipe 06 | 17000 | 2200 |
| Recipe 07 | 27500 | 2800 |

As observed from Tables 1 and 2, higher content of glycine (chelating agent) result in higher remove rate and higher depth of dishing. On the other hand, the remove rate and the content of polishing particles do not exhibit significant correlation. Instead, the depth of dishing becomes higher with increases in the content of polishing particles.

In industrial applications, the remove rate must be high (for example higher than 9000 Å/minute) in order to increase throughput. On the other hand, the depth of dishing must be kept low in order to guarantee the quality of polish. Therefore, recipe 5 which meets the required remove rate is chosen to conduct the following comparative example and experimental examples for decreasing the depth of dishing as much as possible.

Comparative Example 1 (Recipe 8 to Recipe 13)

The polishing slurry composition in comparative example 1 has the same content of chelating agent (glycine), polishing particles (colloidal silica), oxidizing agent (hydrogen peroxide), and corrosion inhibitor (benzotriazole) as recipe 5 does.

A surfactant (sodium dodecyl sulfate, dodecylbenzene sulfonic acid or benzylidene dioxotetrahydro thiazole) is added to a polishing slurry composition made according to recipe 5. Content of the surfactants in recipes 8 to 13 are listed in Table 3. Wafer polishing tests are conducted to observe the effects of different surfactants on remove rates and dishings. The conditions of wafer polishing tests are the same as those mentioned above.

Experimental Example 1 (Recipe 14 and Recipe 15)

The polishing slurry composition in experimental example 1 has the same content of chelating agent (glycine), polishing particles (colloidal silica), oxidizing agent (hydrogen peroxide), and corrosion inhibitor (benzotriazole) as recipe 5 does.

A secondary alcohol ethoxylate, which serves as a nonionic surfactant of the invention and has the structure $R-(OCH_2CH_2)_x-OH$, is added to a polishing slurry composition made according to recipe 5. In each of the following experimental examples, secondary alcohol ethoxylate is secondary alcohol polyoxyethylene ether and its contents in recipes 14 and 15 are listed in Table 3. Wafer polishing tests are conducted to observe the effects of secondary alcohol ethoxylate on remove rates and dishings. The test results for comparative example 1 and experimental example 1 are listed in Table 4 (if a rate of removing copper with a recipe is lower than 9000 Å/minute, then the dishing results are not tested).

In experimental example 1, the wafer polishing conditions are the same as those mentioned above.

TABLE 3

| Sample | dodecyl sulfate (ppm) | Dodecyl benzene sulfonic acid (ppm) | benzylidene dioxotetrahydro thiazole (ppm) | secondary alcohol polyoxyethylene ether | pH |
|---|---|---|---|---|---|
| Recipe 05 | 0.0 | 0.0 | 0.0 | 0.0 | 7.00 |
| Recipe 08 | 25.0 | 0.0 | 0.0 | 0.0 | 7.00 |
| Recipe 09 | 50.0 | 0.0 | 0.0 | 0.0 | 7.00 |
| Recipe 10 | 0.0 | 25.0 | 0.0 | 0.0 | 7.00 |
| Recipe 11 | 0.0 | 50.0 | 0.0 | 0.0 | 7.00 |
| Recipe 12 | 0.0 | 0.0 | 25.0 | 0.0 | 7.00 |
| Recipe 13 | 0.0 | 0.0 | 50.0 | 0.0 | 7.00 |
| Recipe 14 | 0.0 | 0.0 | 0.0 | 25.0 | 7.00 |
| Recipe 15 | 0.0 | 0.0 | 0.0 | 50.0 | 7.00 |

TABLE 4

| Sample | Cu Remove Rate Å/min | Si Remove Rate Å/min | Depth of Dishing Å@ 100/100 um | Depth of Dishing/Cu Remove Rate |
|---|---|---|---|---|
| Recipe 05 | 9650 | 28 | 1450 | 0.150 |
| Recipe 08 | 9200 | 17 | 1350 | 0.147 |
| Recipe 09 | 8800 | — | — | — |
| Recipe 10 | 8000 | — | — | — |
| Recipe 11 | 5500 | — | — | — |
| Recipe 12 | 9000 | 17 | 1150 | 0.128 |
| Recipe 13 | 7900 | — | — | — |
| Recipe 14 | 9500 | 15 | 890 | 0.094 |
| Recipe 15 | 9500 | 14 | 850 | 0.089 |

From the results shown in Tables 3 and 4, it is known that benzylidene dioxotetrahydro thiazole and secondary alcohol ethoxylate (secondary alcohol polyoxyethylene ether in this experimental example) are both capable of protecting copper (that is, reducing the depth of dishing), but the ability of the secondary alcohol ethoxylate to protect copper is even higher. Additionally, as long as a content of the secondary alcohol ethoxylate does not exceed 50 ppm, the Cu remove rate is not decreased. Since small depth of dishing and high remove rate are desired, the polishing slurry compositions are assessed by looking at their ratios of depth of dishing to Cu remove rate, with lower ratios being more desirable. As indicated in Table 4, the polishing slurry compositions in experimental example 1 (recipes 14 and 15) have ratios lower than 0.1. On the other hand, the polishing slurry compositions in comparative example 1 mostly have remove rates lower than 9000 Å/min (recipes 9, 10, 11 and 13), with a few having acceptable remove rates but produce unacceptable depth of dishing (recipes 8 and 12).

Experimental Example 2 (Recipes 15 to 20)

The polishing slurry compositions in experimental example 2 are similar to recipe 15. The difference lies in the content of secondary alcohol ethoxylate in the recipes of experimental example 2, which are respectively 5, 50, 100, 500, 1000, and 5000 ppm. The polishing slurry compositions produced according to the recipes of experimental example 2 are wafer-polishing tested to assess their effects. The wafer polishing conditions are the same as those mentioned above.

TABLE 5

| Sample | secondary alcohol polyoxyethylene ether (ppm) |
| --- | --- |
| Recipe 16 | 5 |
| Recipe 15 | 50 |
| Recipe 17 | 100 |
| Recipe 18 | 500 |
| Recipe 19 | 1000 |
| Recipe 20 | 5000 |

TABLE 6

| Sample | Cu Remove Rate Å/min | Depth of Dishing Å@100/100 um | Depth of Dishing/ Cu Remove Rate |
| --- | --- | --- | --- |
| Recipe 16 | 9750 | 1100 | 0.113 |
| Recipe 15 | 9500 | 850 | 0.089 |
| Recipe 17 | 9250 | 825 | 0.089 |
| Recipe 18 | 8500 | 800 | 0.094 |
| Recipe 19 | 7000 | 700 | 0.100 |
| Recipe 20 | 5000 | 550 | 0.110 |

It is known from the results in Tables 5 and 6 that when a content of secondary alcohol ethoxylate is in the range of 10 ppm~5000 ppm, the polishing slurry compositions have excellent efficiency (Depth of Dishing/Cu Remove Rate is less than or equal to about 0.1). The efficiency is even better when the content of secondary alcohol ethoxylate is in the range of 10 ppm~1000 ppm. The ration of the depth of dishing to the Cu remove rate can be adjusted by changing the content of secondary alcohol ethoxylate to meet practical demands.

Experimental Example 3 (Recipe 15, Recipes 21-24)

The polishing slurry compositions in experimental example 3 are similar to recipe 15. The difference lies in the addition of potassium hydroxide or sulfuric acid to control the pH value of each recipe (as shown in Table 7). The polishing slurry compositions produced according to recipes from experimental example 3 are wafer-polishing tested to assess their effects. The wafer polishing conditions are the same as those mentioned above.

TABLE 7

| Sample | pH |
| --- | --- |
| Recipe 15 | 7.00 |
| Recipe 21 | 3.00 |
| Recipe 22 | 5.00 |
| Recipe 23 | 9.00 |
| Recipe 24 | 11.00 |

TABLE 8

| Sample | Cu Remove Rate Å/min | Depth of Dishing Å@100/100 um | Depth of Dishing/ Cu Remove Rate |
| --- | --- | --- | --- |
| Recipe 15 | 9500 | 850 | 0.089 |
| Recipe 21 | 8000 | 1150 | 0.143 |
| Recipe 22 | 9000 | 950 | 0.105 |
| Recipe 23 | 8500 | 925 | 0.109 |
| Recipe 24 | 6000 | 550 | 0.092 |

It is known from the results in Tables 7 and 8 that when a pH value of the polishing slurry composition is in the range of 5 to 11 pH, the polishing slurry compositions have excellent efficiency (Depth of Dishing/Cu Remove Rate is less than or equal to about 0.1). It is known from the above that the ratio of the depth of dishing to the Cu remove rate can be adjusted by changing the pH of the polishing slurry composition to meet practical demands.

In chemical mechanical polishing, the polishing pad and the object to be polished (for example a wafer) may have non-uniform distribution of stress in vicinities of the contact surface. This creates the dishing effect. However, attempts to decrease the extent of dishing often lead to insufficient remove rates. According to the invention, the polishing slurry composition has the non-ionic surfactant represented by formula (1) which, as compared to typical surfactants, has the effect of protecting metals. Therefore, the polishing slurry composition of the invention has the effects of maintaining the required remove rate and reducing the extent of dishing.

Though the invention has been disclosed above by the embodiments, they are not intended to limit the invention. It will be apparent to one of ordinary skill in the art that modifications and variations to the described embodiments may be made without departing from the spirit and scope of the invention. Therefore, the protecting range of the invention falls in the appended claims.

What is claimed is:
1. A polishing slurry composition, comprising a non-ionic surfactant represented by formula (1),

R—(OCH$_2$CH$_2$)$_x$—OH        formula (1)

wherein x is an integer between 1 and 50, and
R is selected from a group consisting of a C3-C50 alkyl group, a C6-C55 benzylalkyl group and a C6-C55 phenylalkyl group, and wherein the non-ionic surfactant is a secondary alcohol ethoxylate, a pH value of the polishing slurry composition is between 5 and 11, and based on a total weight of the polishing slurry composition, a content of the non-ionic surfactant is between 5 ppm and 100 ppm.

2. The polishing slurry composition of claim 1, wherein x is an integer between 7 and 40.

3. The polishing slurry composition of claim 1, wherein the non-ionic surfactant is represented by formula (2),

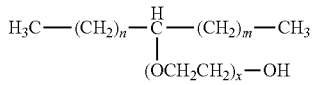

formula (2)

wherein m+n is an integer between 2 and 15.

4. The polishing slurry composition of claim 1, further comprising an oxidizing agent.

5. The polishing slurry composition of claim 4, wherein the oxidizing agent is one or more selected from a group consisting of permanganate salt, peroxyacid, iodate salt, oxybromide salt, ceric salt, bromate salt, hydrogen peroxide, chlorite salt and hypochlorite salt.

6. The polishing slurry composition of claim 4, wherein based on a total weight of the polishing slurry composition, a content of the oxidizing agent is between 0.5% and 10%.

7. The polishing slurry composition of claim 1, further comprising polishing particles.

8. The polishing slurry composition of claim 7, wherein based on a total weight of the polishing slurry composition, a content of the polishing particles is between 100 ppm and 5000 ppm.

9. The polishing slurry composition of claim 7, wherein an average diameter of the polishing particles is between 5 nm and 300 nm.

10. The polishing slurry composition of claim 7, wherein an average diameter of the polishing particles is between 5 nm and 100 nm.

11. The polishing slurry composition of claim 7, wherein the polishing particles comprise one or more selected from a group consisting of silicon dioxide, aluminum oxide, cerium oxide, zirconium dioxide and titanium dioxide.

12. The polishing slurry composition of claim 1, further comprising a pH adjustor.

13. The polishing slurry composition of claim 12, wherein the pH adjustor is one or more selected from a group consisting of potassium hydroxide, triethanolamine, 2,2,2-nitrilotriethanol, nitric acid, sulfuric acid, oxalic acid and citric acid.

14. The polishing slurry composition of claim 12, wherein a content of the pH adjustor is between 5 ppm and 10,000 ppm based on a total weight of the polishing slurry composition.

15. The polishing slurry composition of claim 1, further comprising a chelating agent.

16. The polishing slurry composition of claim 15, wherein the chelating agent comprises inorganic acids, organic acids or amino acids.

17. The polishing slurry composition of claim 16, wherein the chelating agent is one or more selected from a group consisting of citric acid, diethylenetriaminepentaacetate, ammonium oxlate, tartaric acid, oxalic acid, maleic acid, lactic acid, succinic acid, histidine, alanine, glycine, aspartate, glutamine, serine and arginine.

18. The polishing slurry composition of claim 15, wherein a content of the chelating agent is between 0.1% and 10% based on a total weight of the polishing slurry composition.

19. The polishing slurry composition of claim 1, further comprising an corrosion inhibitor.

20. The polishing slurry composition of claim 19, wherein said corrosion inhibitor is one or more selected from a group that consists of 1-H-benzotriazole, N-acyl sarcosinate, ammonium dodecylsulfate, tolyltriazole, 5-amino tetrazole, 3-amino-1,2,4-triazole, 4-amino-4H-1,2,4-triazole, 3-nitro-1,2,4-triazole, 3-mercapto-1,2,4-triazole, 1H-1,2,3-triazole-ethanol, benzimidazole, imidazole, pyrrole, pyrroline, oxazole, isoxazole, indazole, indolizine, 1,2,3-triazole, 1,2,4-triazole, methylbenzotriazole, 2-mercaptobenzothiazole, benzylidene dioxotetrahydro thiazole, thenylidene dioxotetrahydro thiazole and dodecylbenzene sulfonic acid.

21. The polishing slurry composition of claim 19, wherein a content of the corrosion inhibitor is between 1 ppm and 1000 ppm based on a total weight of the polishing slurry composition.

22. The polishing slurry composition of claim 1, further comprising an aqueous carrier.

23. The polishing slurry composition of claim 22, wherein a content of the aqueous carrier is between 50% and 99% based on a total weight of the polishing slurry composition.

24. The polishing slurry composition of claim 22, wherein the aqueous carrier comprises deionized water.

* * * * *